(12) United States Patent
Liu et al.

(10) Patent No.: US 8,145,058 B2
(45) Date of Patent: Mar. 27, 2012

(54) OPTICAL NETWORK UNIT TRANSCEIVER MODULE HAVING DIRECT CONNECT RF PIN CONFIGURATION

(75) Inventors: Jinxiang Liu, Singapore (SG); Tat Ming Teo, Singapore (SG)

(73) Assignee: Finisar Corporation, Inc., Sunnyvale, CA (US)

( * ) Notice: Subject to any disclaimer, the term of this patent is extended or adjusted under 35 U.S.C. 154(b) by 817 days.

(21) Appl. No.: 12/188,132

(22) Filed: Aug. 7, 2008

(65) Prior Publication Data

US 2009/0047027 A1 Feb. 19, 2009

Related U.S. Application Data

(60) Provisional application No. 60/955,489, filed on Aug. 13, 2007.

(51) Int. Cl.
*H04B 10/24* (2006.01)
(52) U.S. Cl. .................................................. 398/135
(58) Field of Classification Search ............... 398/66, 398/135–139
See application file for complete search history.

(56) References Cited

U.S. PATENT DOCUMENTS

| | | | |
|---|---|---|---|
| 7,258,264 B2 | 8/2007 | Ice et al. | |
| 7,664,405 B2 * | 2/2010 | Paulson | 398/164 |
| 2004/0208601 A1 * | 10/2004 | Tan et al. | 398/135 |
| 2005/0208797 A1 | 9/2005 | Duncan et al. | |
| 2005/0254757 A1 * | 11/2005 | Ferretti et al. | 385/88 |
| 2007/0250872 A1 * | 10/2007 | Dua | 725/81 |
| 2007/0274646 A1 | 11/2007 | Sharpson et al. | |

OTHER PUBLICATIONS

ThomasNet Industrial NewsRoom, Archive News Story; SMB Interconnect suits board-to-board applications, Aug. 5, 2005 and Archive Press Release; Bomar's New SMB Interface for Board-to-Board Applications, Jul. 28, 2005. [online] [retrieved on Aug. 6, 2008] 3 pages, Retrieved from the Internet: http://news.thomasnet.com/fullstory/466008.

* cited by examiner

*Primary Examiner* — Leslie Pascal
(74) *Attorney, Agent, or Firm* — Maschoff Gilmore & Israelsen

(57) ABSTRACT

Systems and method for using a direct connect RF pin configuration for an ONU transceiver module to connect directly to an external component. The ONU module communicates with an optical network. The ONU module further includes an RF interface and a direct connect RF pin configuration to communicate using RF signals. In one embodiment, the direct connect RF pin configuration includes two ground pins and a data pin which are spaced apart and directly connected to a PCB of the ONU. The opposing ends of the pins are directly connected to a PCB of an external component, such as an ONU host box. The pins are thus spaced apart such that they do not impede each others' function and available for direct connection to the external component.

19 Claims, 6 Drawing Sheets

OPTICAL NETWORK UNIT TRANSCEIVER MODULE HAVING DIRECT CONNECT RF PIN CONFIGURATION

CROSS-REFERENCE TO RELATED APPLICATIONS

This application claims the benefit of and priority to U.S. Provisional Patent Application Ser. No. 60/955,489 filed on Aug. 13, 2007, which application is incorporated herein by reference in its entirety.

BACKGROUND OF THE INVENTION

1. The Field of the Invention

The present invention relates to optical network unit (ONU) transceiver modules. More particularly, the present invention relates to ONU transceiver modules having individual pins to couple an RF interface component of the module to an external component, such as an optical network unit host box.

2. Background

Passive optical networks (PON) allow a host to communicate efficiently with a number of users. A PON infrastructure often includes an optical line termination (OLT) unit on the carrier side of the network and a pluggable optical network unit (ONU) transceiver module on the user's side. The OLT is operatively associated with many ONUs through a passive optical splitter. In particular, a single line of fibers is often directed from the OLT to the passive optical splitter. Additional fibers then run from the passive optical splitter to each of the ONUs. Optical signals coming from the OLT are split and directed along the additional fibers to the ONUs. Optical signals from the ONUs are sent directly from the ONU to the passive optical splitter, which allows the signal to be passed on to the OLT. In such a configuration, the bandwidth is shared between the ONUs by allocating various time slots in which the ONUs transmit to the OLT and other time slots in which the OLT is transmitting to the ONUs or by selecting different wavelengths for use by the OLT and the ONU. A group of ONUs may reside on the same host, such as an ONU host box.

Recent efforts have been directed toward configuring PONs to receive/transmit radio frequency (RF) signals, such as media or broadcast signals used in, but not limited to televisions, radios, and the like. Accordingly, ONUs have been configured to receive RF signals sent over the PON, allowing the ONUs to communicate via optical, electrical and RF signals. However, it would be advantageous to reduce costs of manufacturing ONUs and, hence, generate competitive pricing for ONUs.

BRIEF SUMMARY

These and other limitations are overcome by embodiments of the invention which relate to methods and devices for connecting an RF interface on an ONU module with an external component in a manner which reduces the cost associated with manufacturing ONU systems.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

One embodiment of the invention includes an optical network unit (ONU) transceiver module that includes a housing, a printed circuit board disposed in the housing, an optical connector disposed on the printed circuit board and configured to connect to an optical fiber to access an optical network, a transmit line including a laser driver coupled to the optical connector and a laser for transmitting optical signals through the optical fiber, and a receive line including an optical receiver coupled to the optical connector and a first post amplifier for converting optical signals to electrical signals. The ONU module further includes an RF interface disposed on the printed circuit board and configured to receive and transmit RF signals to and from the external component and convert RF signals to electrical signals and vice versa, and a direct connect RF pin configuration having at least one ground pin, at least one data pin spaced apart from at least one data pin, and means for connecting a first end of the at least one ground pin and the at least one data pin to the RF interface. The second end of the at least one ground pin and the at least one data pin extends outwardly through two or more apertures of the housing such that the second end of each pin is available to be directly connected to the external component. Means for securing the direct connect RF pin configuration includes soldering, welding, conductive epoxy, conductive adhesive, a slip fit connection, and the like.

Another embodiment of the invention includes a method for providing a direct connection between a PCB of an ONU module RF interface and a PCB of an external component using a direct connect RF pin configuration. The method includes determining a desired impedance for at least one ground pin and at least one data pin, tuning one or more characteristics of the at least one ground pin and the at least one data pin to achieve the desired impedance, securing a first end of the at least one ground pin and the at least one data pin to a PCB of an RF interface of an optical network unit such that the at least one ground pin is spaced apart from the at least one data pin, disposing a second end of the at least one ground pin and the at least one data pin through two or more apertures of a housing of the optical network unit wherein the second end of the at least one ground pin and the at least one data pin extends outwardly and is available to be directly connected to an external component, and securing the second end of the at least one ground pin and the at least one data pin to a PCB of the external component.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

The present invention relates to optical network unit (ONU) transceiver modules, which allow users access to an optical communication network. The ONU is positioned on an optical access line and converts optical data to electrical data. ONUs are generally configured to be pluggable into a host box printed circuit board (PCB). In particular, the present invention relates to systems, methods and devices for connecting an RF interface on an ONU with an external component (such as a host box PCB) in a manner which drastically reduces the cost associated with manufacturing the ONU systems.

Figure 1:
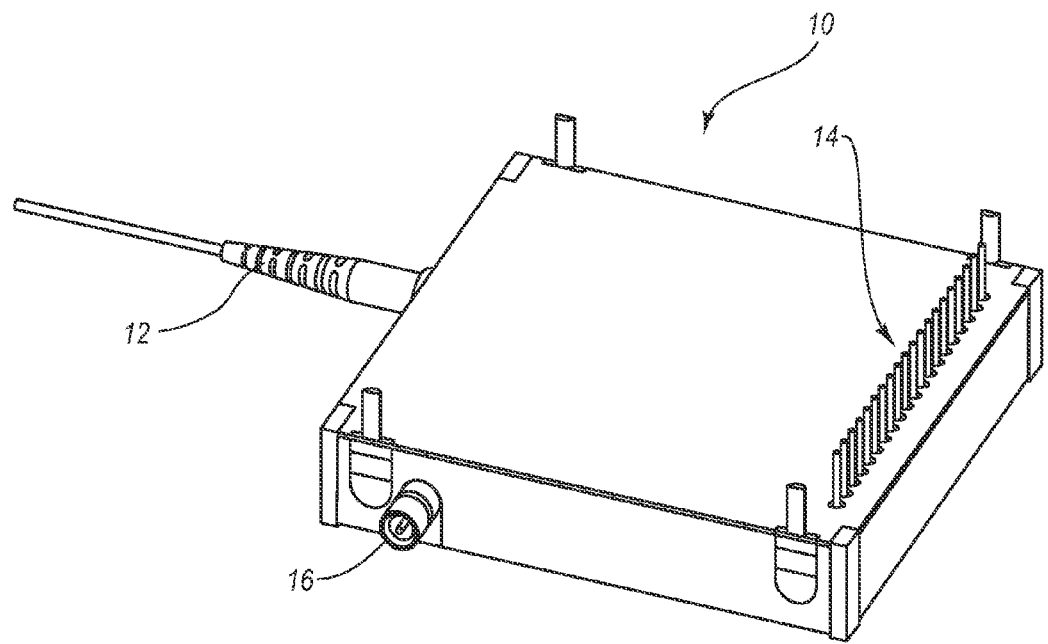
FIG. 1 illustrates a prior art optical network unit (ONU) having a mini coaxial RF connector which allows for connection to an external component via a cable.

FIG. 1 illustrates a conventional ONU module 10 capable of connection to a fiber optic cable 12 for the input and output of optical and/or other electromagnetic signals. ONU transceiver module has I/O pins 14 for communicating with an external host via electrical signals. Additionally, FIG. 1 illustrates that ONU module 10 uses a subminiature coaxial RF connector 16, such MMCX, MCX, FME, SMA, SMB, or SMC connector, to connect an RF interface inside the ONU module 10 with an external component (such as the PCB of a host box) via a connector cable (not shown).

Figure 2A:
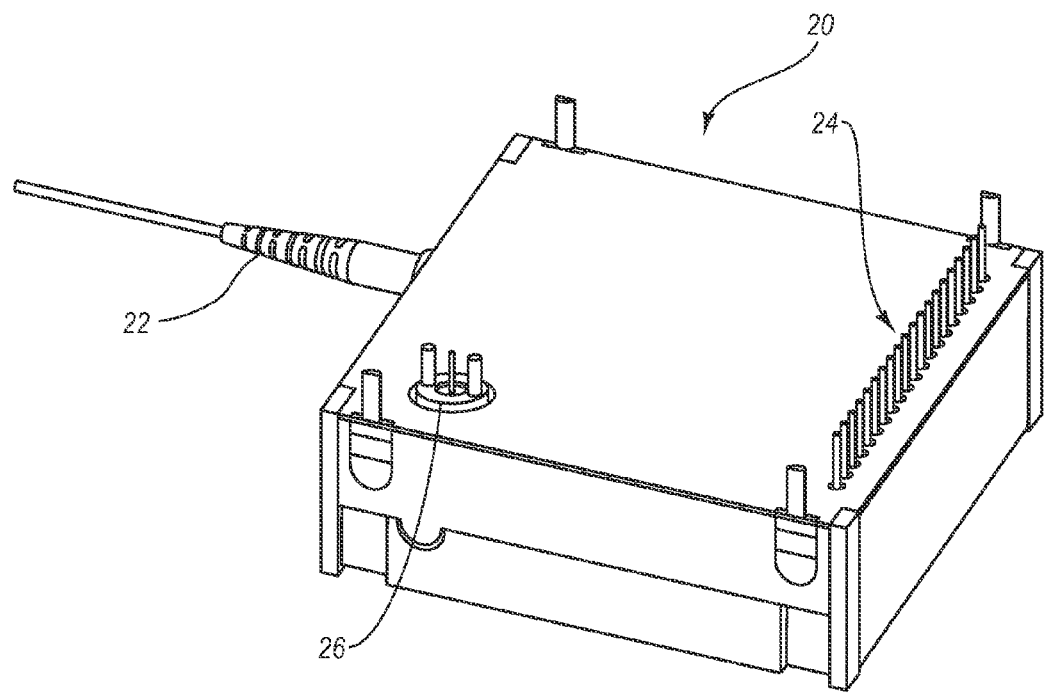
FIG. 2A illustrates a prior art ONU having an RF connector which allows for direct connection to an external component.

FIG. 2A illustrates another prior art ONU module 20 that connects to a fiber optic cable 22 for input/output of optical signals and communicates electrically via I/O pins 24. ONU module 20 also includes an RF connector 26 that provides direct connection between the ONU module 20 and an external component. One example of this type is shown in further detail in FIG. 2B.

Figure 2B:
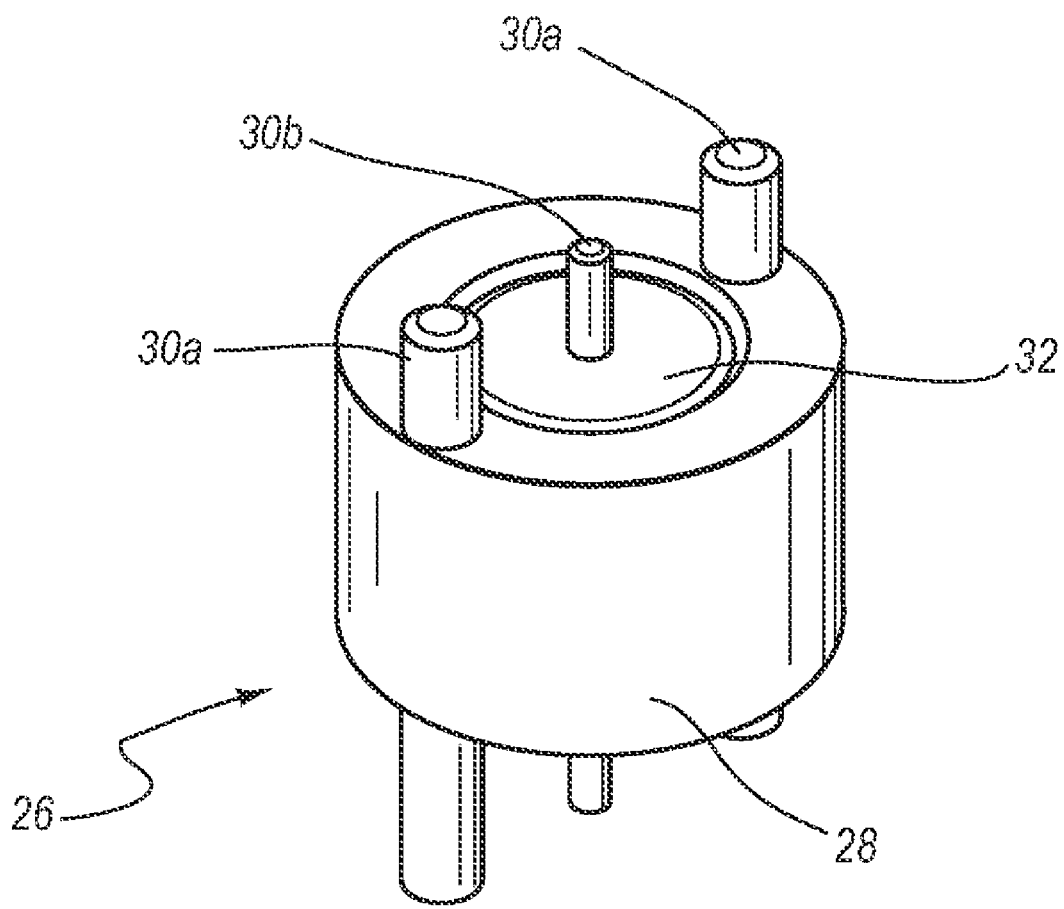
FIG. 2B illustrates the prior art RF connector in further detail.

FIG. 2B illustrates that the connector 26 includes a metal casing 28 with integral peripheral pin features 30a. In the illustrated example, the peripheral pin features 30a may be ground pins. The connector 26 also includes a central pin 30b, which may be a data pin. The central pin 30b is coupled to a central plastic portion 32, which may serve to isolate the central pin 30b from the peripheral pins 30a, thereby preserving the separate function of each pin type. Accordingly, the connector 26 includes pin features which are secured together with an intervening structure that maintains the pins spaced apart. The ends of peripheral pin features 30a and central pin 30b extend from the top and bottom of the metal casing 28 and plastic portion 32, respectively, to enable the RF connector to be connected to the ONU module as well as to an external component. However, both the RF connector configurations of FIG. 1 and FIG. 2 add to the cost and complexity involved in connecting an ONU module RF interface to external components.

Figure 3:
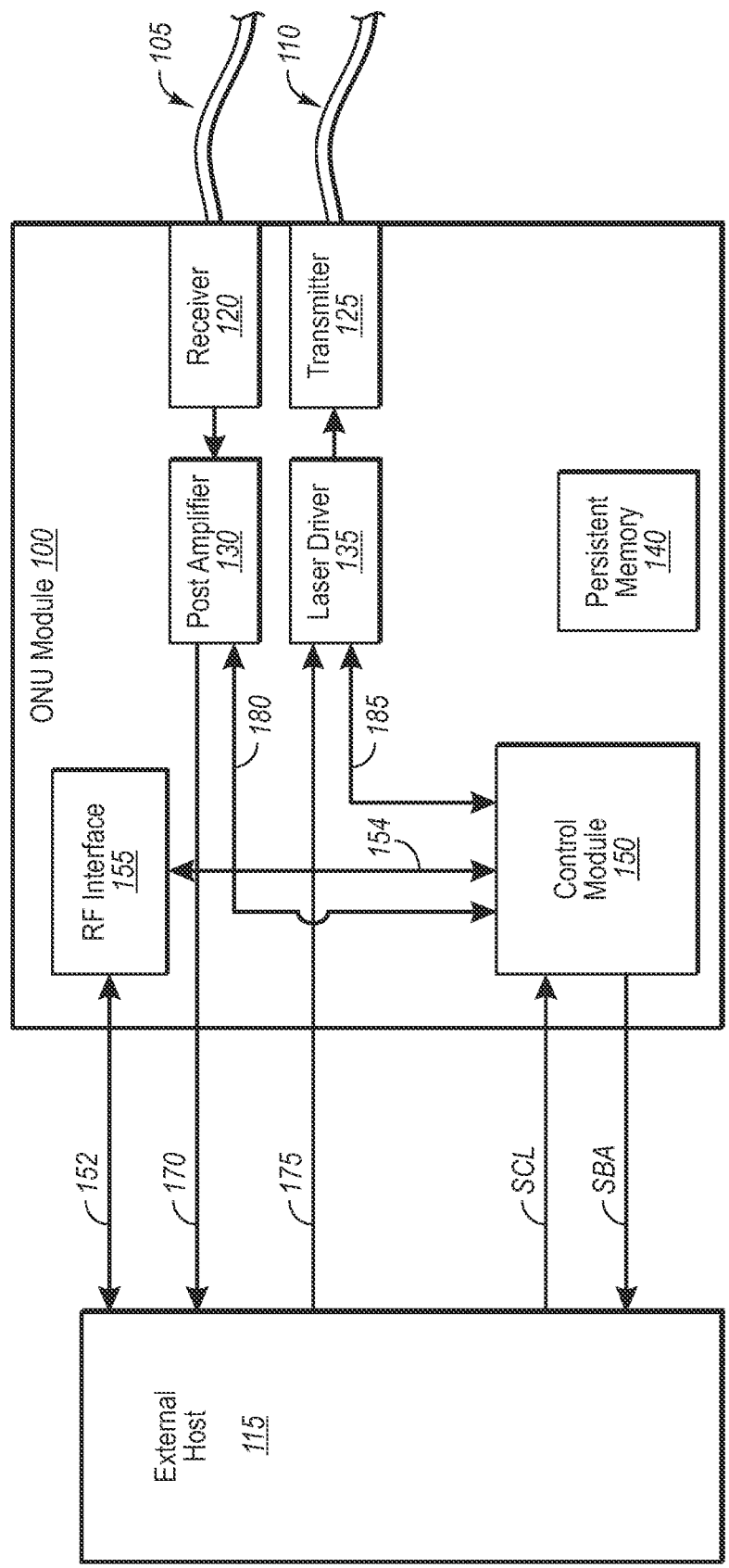
FIG. 3 schematically illustrates an example of an ONU that may be implemented in the present invention.

In contrast, the present invention provides systems, methods and devices for connecting an RF interface on an ONU module with an external component in a manner which reduces the cost associated with manufacturing ONU systems. Turning to FIG. 3, a schematic diagram of one embodiment of an ONU module 100 is illustrated. The ONU module 100 receives an optical signal from fiber 105 using receiver 120. The receiver 120 acts as an opto-electric transducer by transforming the optical signal into an electrical signal. The receiver 120 provides the resulting electrical signal to a post-amplifier 130. The post-amplifier 130 amplifies the electrical signal and provides the amplified signal to an external host 115 as represented by arrow 170. The external host 115 may be, in one example, an ONU host box capable of housing and communicating with multiple ONU modules.

The ONU module 100 may also receive electrical signals from the host 115 for transmission onto the fiber 110. Specifically, the laser driver 135 receives an electrical signal from host 115 as represented by the arrow 175, and drives the transmitter 125 (e.g., a laser or Light Emitting Diode (LED)) to emit optical signals onto the fiber 110, where optical signals are representative of the information in the electrical signal provided by the host 115. Accordingly, the transmitter 125 serves as an electro-optic transducer. Thus, the receiver 120 and transmitter 125 provide an optical connection to the optical fibers 105, 110. In one embodiment, the fibers 105 and 110 may be combined in a single coaxial optical fiber cable.

The ONU module 100 includes a control module 150, which may evaluate operating conditions, such as, but not limited to, temperature, voltage, and low frequency changes (such as receive power) from the post-amplifier 130 (as represented by arrow 180) and/or from the laser driver 135 (as represented by arrow 185). This allows the control module 150 to optimize the dynamically varying performance, and additionally detect when there is a loss of signal. The control module 150 can also control the operation of post amplifier 130, and/or laser driver 135, and, hence, can control the operation of ONU module 100. The control module 150 can also communicate with host 115 using, for example, a two-wire I2C interface shown as the serial data (SDA) and serial clock (SCL) lines.

The control module 150 may have access to a persistent memory 140, which in one embodiment, is an Electrically Erasable and Programmable Read Only Memory (EEPROM). The persistent memory 140 and the control module 150 may be packaged together in the same package or in different packages without restriction. Persistent memory 140 may also be any other non-volatile memory source.

The ONU module 100 also includes an RF interface 155 which is configured to receive and/or transmit video and/or RF signals from and/or to external host 115 as shown by line 152. The RF interface also converts RF signals to electrical signals and can communicate those signals to and from control module 150 as shown by line 154. The ONU module 100 is thus configured to be able to communicate via optical, electrical and RF signals. Generally, the components of the ONU module 100 are connected (e.g., soldered) to a printed circuit board (not shown).

Figure 4A:
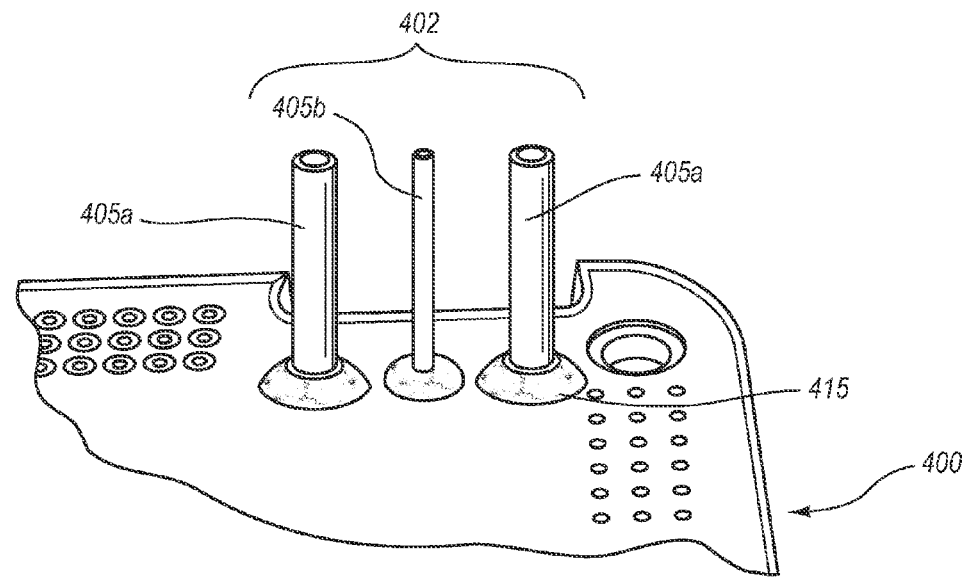
FIG. 4A illustrates an interior view of an optical network unit showing a direct connect RF pin configuration according to one example of the present invention.

Turning to FIG. 4A, the RF interface of the ONU module includes a direct connect RF pin configuration 402. FIG. 4A illustrates a portion of a printed circuit board (PCB) 400 of an ONU module and a portion of an RF interface in particular. In the embodiment of FIG. 4A, the direct connect RF pin configuration 402 comprises three spaced-apart pins—two ground pins 405a and a central data pin 405b. The pins 405a, 405b are secured directly to the PCB 400 of the RF interface using a connection means 415. The connection means 415 may be made using welding, solder, conductive adhesive, conductive epoxy, slip fit, and the like. The central data pin 405b and ground pins 405a are configured to extend outwardly such that they can be connected directly to the PCB of an external component (not shown). Furthermore, the direct connection of the pins 405a, 405b to the PCB 400 of the ONU module serves to maintain the pins spaced apart so that they do not impede each other in their respective functions. As such, the RF interface will be able to communicate directly with the PCB of the external component.

The characteristics of the pins for the direct connect RF pin configuration include size, composition and attachment method that can be selected to tune the impedance of the RF interface to about 50Ω or about 75Ω. Such tuning can be achieved through iterative adjustments. Tuning may also be achieved via simulations using software. Adjustments to the characteristics of the pins can include changing the diameter of the ground pins to be about 4 mm or using ground pins that are larger in diameter than the data pin.

Characteristics of the pins can also be selected to limit the back reflection of power at the RF interface. Back reflection is the amount of incident power reflected back at the source measured in decibels (dB). The characteristics of the pins can be adjusted so that the back reflection is less than about −16 dB, less than about −26 dB, less than about −30 dB, or less than about −40 dB at frequencies at about 1 GHz. Further a buffer may be added of about 10 dB.

While a three-pin direct connect RF pin configuration will be shown and described in FIGS. 4A through 5B, in some embodiments, only a single ground pin and a single data pin could be used. Alternatively, more than one ground pin and more than one data pin could also be used. Further, while the pins are shown as substantially cylindrical, it will be appreciated that ground pins and/or data pins may have varying cross sections along the length thereof. For example, the ends of the pins may be wider than an intermediate portion of the pin to provide more surface area in order to make the pins more easily connected to the PCB of either the ONU module or the external component. Further, the sizes of the ground pins and data pin could differ. In one embodiment, a fat ground pin design is used. Finally, the spacing between pins and alignment of pins may vary depending on design considerations.

Figure 4B:
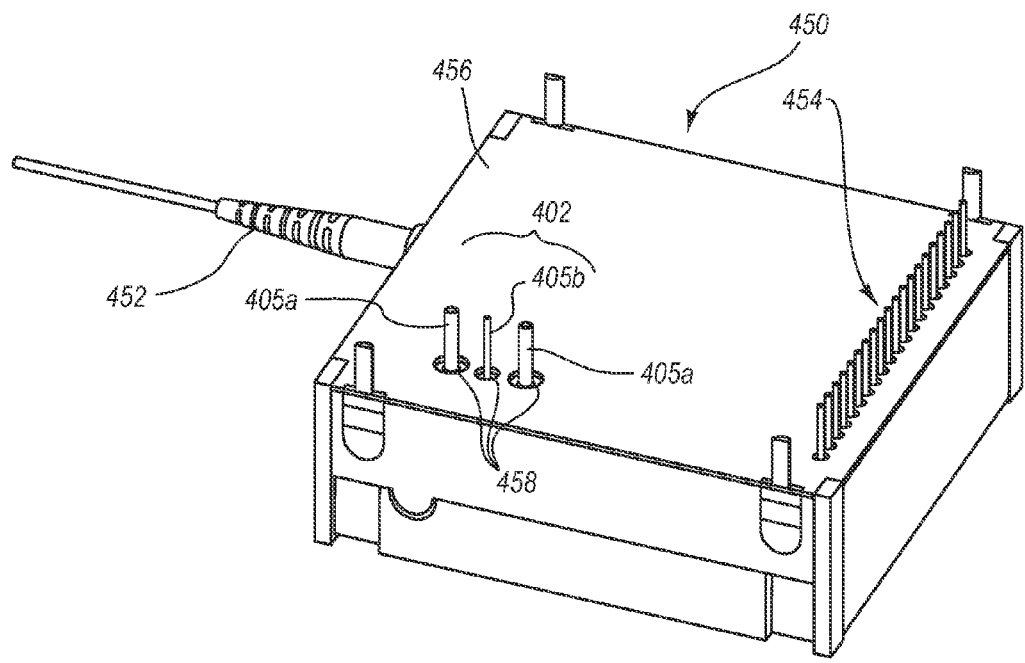
FIG. 4B illustrates an ONU having direct connect RF pin configuration available for direct connection to an external component.

FIG. 4B illustrates an example of a ONU module 450 incorporating the novel direct connect RF pin configuration of FIG. 4A to enable a direct connection to be formed during assembly of an ONU system between the RF interface of the ONU module 450 and an external component (not shown). The ONU module 450 includes connection to a fiber optic cable 452 for the input and output of optical and/or other electromagnetic signals. ONU module 450 has I/O pins 454 for communicating with an external host via electrical signals.

ONU module 450 also includes an RF interface having a direct connect RF pin configuration 402 that is directly connected to an RF interface located on a PCB (not shown) of the ONU module 450 (see FIG. 4A). The housing 456 of the ONU module 450 includes three apertures 458 sized and placed to allow the individual pins 405a, 405b to be disposed therethrough. When the pins 405a, 405b are disposed through apertures 458, they extend outwardly so that they are available for direct connection to an external component (not shown). Preferably, the apertures do not touch the sides of the pins. However, in some embodiments, the apertures may touch the sides of the pin, but it should be noted that the primary source for maintaining the pins as spaced apart comes from the direct connection of the pins to the PCB of the ONU module that serves to maintain the pins spaced apart so that they do not impede each other in their respective functions. In one example, means for directly connecting the direct connect RF pin configuration to the external component include, but are not limited to, soldering, welding, conductive adhesive, conductive epoxy, or slip fitting the exposed ends of the pins 405a, 405b to a PCB of an external component.

As will be appreciated, the particular direct connect RF pin configuration shown in FIGS. 4A and 4B allows for the same benefits as conventional RF connectors, while drastically reducing the cost associated with conventional RF connector designs, such as eliminating plastic and/or a metal casing, removing additional hardware such as a RF cable, as well as eliminating the need for more costly locking mechanisms, screw-type mechanisms, and the like. In one example, it is estimated that the present invention results in a cost reduction of about 95%.

As discussed above, the individual pins for the direct connect RF pin configuration may be numbered, sized, shaped, spaced apart, and/or aligned in various manners to achieve a particular RF design configuration.

Figure 5A:
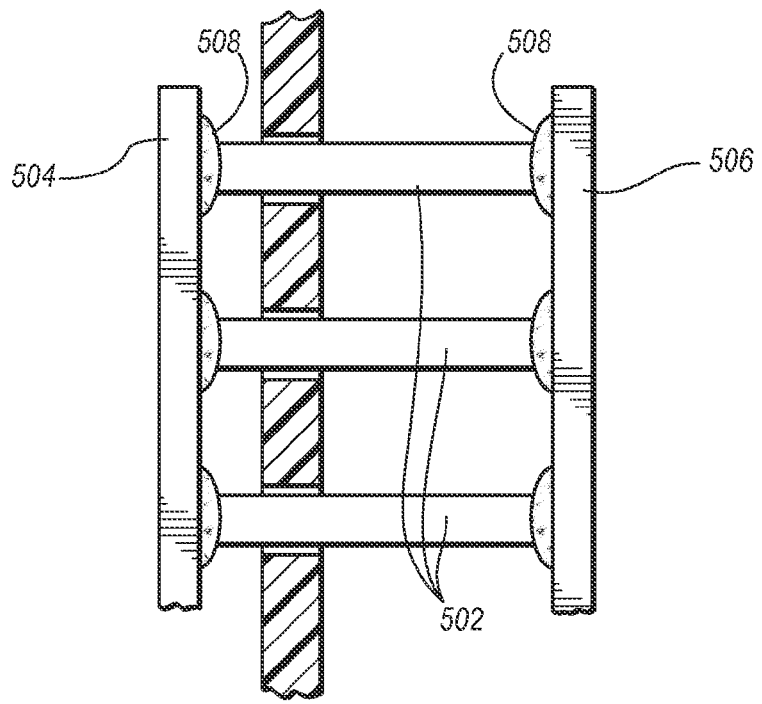
FIGS. 5A and 5B illustrate two different examples of securing the direct connect RF pin configuration according to aspects of the present invention.

FIG. 5A illustrates one embodiment for connecting the direct connect RF pin configuration of the ONU module to a PCB of an external component. In this embodiment, the direct connect RF pin configuration comprises a plurality of pins 502. As mentioned above, the pins may be one or more ground pins and one or more data pins. The PCB 504 of the ONU module is directly connected to pins 502 using solder 508. On the other side, the pins 502 are directly connected to a PCB 506 of an external component using solder 508. The direction connection of the pins 502 to the PCB 504 of the ONU module serves to maintain the pins 502 spaced apart so that they do not impeded each other in their respective functions.

Figure 5B:
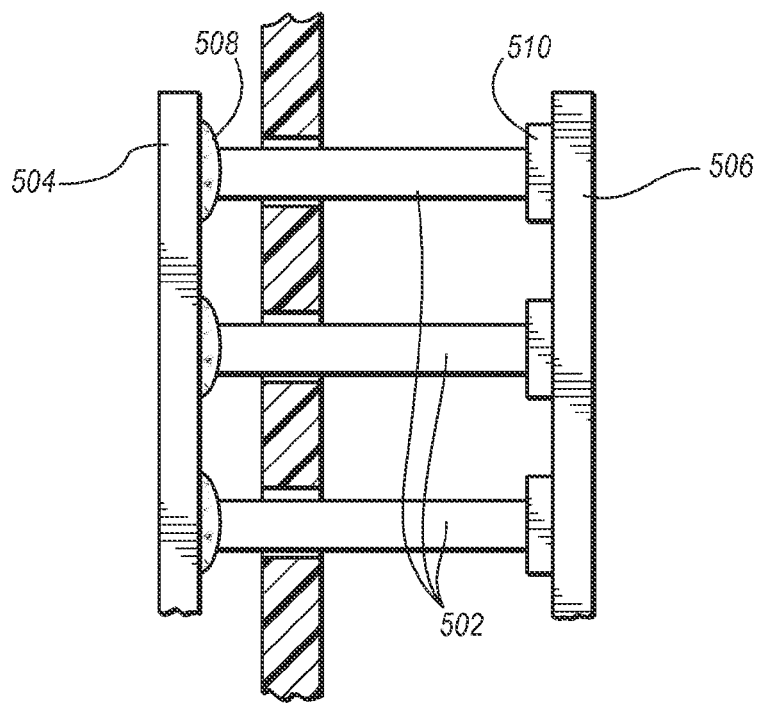

FIG. 5B illustrates that pins 502 can be connected to the PCB 506 of an external component using a slip fit connection. For example, slip fit connection may include a plurality of female receptacles 510 disposed on PCB 506, each sized and spaced to receive one of the pins 502. As such, pins 502 are able to make contact with the conductive female receptacle 510 and may be further bonded to the female receptacles using solder, adhesive, epoxy, and the like. FIGS. 5A and 5B are presented only by way of example and not by way of limitation. As discussed above, other means for directly connecting the pins 502 to PCB 504 and/or 506 can be utilized. For example, a slip fit connection may be used at both ends of the pins 502 rather than just on one end, or, other connections means may be used such as welding, conductive epoxy, conductive adhesive, and the like.

Figure 6:
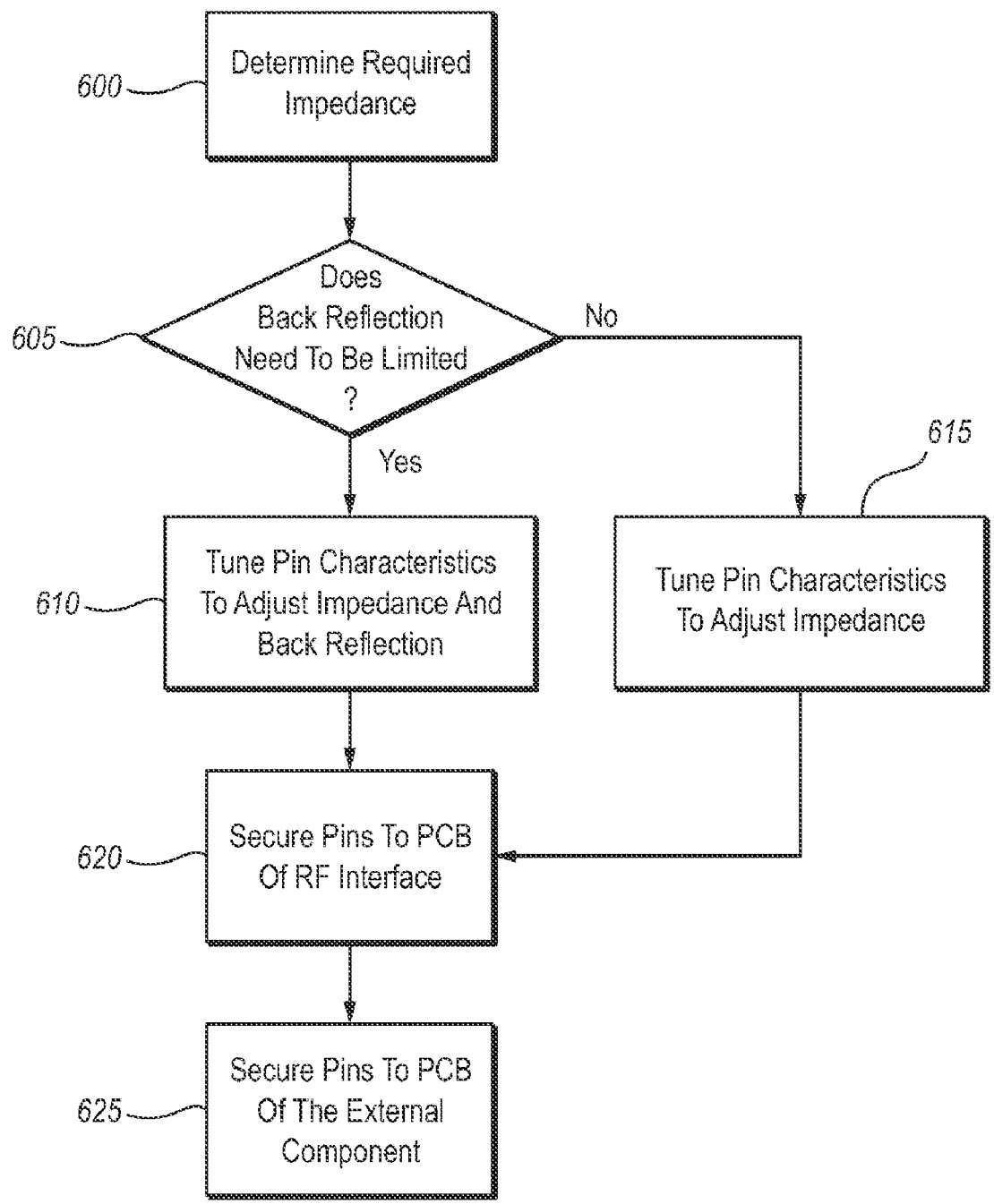
FIG. 6 is a flow diagram illustrating a method for providing a direct connection between the PCB of an RF interface to the PCB of an external component with direct connect RF pin configuration.

FIG. 6 illustrates a method for securing an ONU module and an external component using the novel direct connect RF pin configurations of the present invention. In at least one example, a method includes determining a desired impedance or range of impedance (600). The method may also include selecting the characteristics of one or more of the pins to limit the back reflection at the interface (605) and then tuning the characteristics of the pins including size, shape, composition and attachment method of one or more of the pins to achieve the desired impedance (610) and/or back reflection (615). In one example tuning the characteristics of one or more of the pins includes utilizing optimization software. In other cases, the characteristics may be selected and analyzed and then iteratively changed to achieve the desired impedance and/or back reflection range. In one embodiment, the characteristics of the pins may be selected based on the configuration of the PCB of the external component and whether the external component utilizes a particular PCB connection, such as a slip fit connection having a particular size, shape or spacing.

The method may also include connecting one end of a pin directly to the PCB of an ONU module RF interface 620 and then connecting the second end of the pin directly to the PCB of the external component 625. In particular, the connection to the RF interface and to the external component includes the pins being separated from each other while directly securing the pins to the PCB of the RF interface and to the PCB of the external component, such as by welding, soldering, conductive epoxy, conductive adhesive, slip fit connection, and the like. The process may be performed as many times as desired. Accordingly, the method provides that an RF interface can be directly connected to an external component using a direct connect RF pin configuration. Further, the direct connections at the PCB boards maintain the pins as spaced apart so that no additional intervening structure is required along the length of the pins to keep the pins spaced apart. Thus, the pins are able to keep spaced apart so as to not impede each others functions, while the air between the pins provides sufficient insulatory function.

Embodiments of the invention have referred to optical network unit transceiver modules. However, those of skill in the art will appreciate that the concepts taught herein with regard to novel direct connect RF pin configurations may be applied to any other opto-electronic module or device. Furthermore, embodiments of opto-electronic modules described herein have been described as including both hardware and/or software components.

Embodiments may also include physical computer-readable media and/or intangible computer-readable media for carrying or having computer-executable instructions, data structures, and/or data signals stored thereon. Such physical computer-readable media and/or intangible computer-readable media can be any available media that can be accessed by a general purpose or special purpose computer. By way of example, and not limitation, such physical computer-readable media can include RAM, ROM, EEPROM, optical storage devices, magnetic storage devices, semiconductor storage media, solid-state storage media, or any other physical medium which can be used to store desired data in the form of computer-executable instructions, data structures and/or data signals, and which can be accessed by a processor. Within the opto-electronic modules, intangible computer-readable media can include electromagnetic means for conveying a data signal from one part of the module to another, or even exterior of the module, such as through circuitry residing in the module.

When information is transferred or provided over a network or another communications connection (either hardwired, wireless, or a combination of hardwired or wireless) to a host or other external component, hardwired devices for sending and receiving computer-executable instructions, data structures, and/or data signals (e.g., wires, cables, optical fibers, electronic circuitry, chemical, and the like) should properly be viewed as physical computer-readable mediums while wireless carriers or wireless mediums for sending and/or receiving computer-executable instructions, data structures, and/or data signals (e.g., radio communications, satellite communications, infrared communications, and the like) should properly be viewed as intangible computer-readable mediums. Combinations of the above should also be included within the scope of computer-readable media.

Computer-executable instructions include, for example, instructions, data, and/or data signals which cause the opto-electronic module to perform a certain function or group of functions. Although not required, aspects of the invention have been described herein in the general context of computer-executable instructions, such as program modules, being executed by a processor, in network environments and/or non-network environments. Generally, program modules include routines, programs, objects, components, and content structures that perform particular tasks or implement particular abstract content types. Computer-executable instructions, associated content structures, and program modules represent examples of program code for executing aspects of the methods disclosed herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A optical network unit (ONU) transceiver module comprising:
a housing;
a printed circuit board disposed in the housing;
a laser driver disposed on the printed circuit board and configured to receive electrical signals from an external component;
a laser coupled to the laser driver and configured to transmit optical signals through an optical fiber;
an optical receiver coupled to a post amplifier and configured to convert optical signals to electrical signals;
the post amplifier, wherein the post amplifier is disposed on the printed circuit board and is configured to communicate electrical signals to the external component;
an RF interface separate from the laser driver and the post amplifier, wherein the RF interface is disposed on the printed circuit board and is configured to receive and transmit RF signals to and from the external component and convert RF signals to electrical signals and vice versa, the RF signals being different than both the electrical signals received by the laser driver and the electrical signals communicated by the post amplifier; and
a direct connect RF pin configuration comprising;
at least one ground pin;
at least one data pin spaced apart from at least one other data pin; and
means for connecting a first end of the at least one ground pin and the at least one data pin to the RF interface,
wherein a second end of the at least one ground pin and the at least one data pin extends outwardly through the housing such that the second end of each pin is available to be directly connected to the external component.

2. An ONU transceiver module according to claim 1, wherein the RF interface is tuned to an impedance of about 50Ω or about 75Ω.

3. An ONU transceiver module according to claim 1, wherein the RF interface has a back reflection of less than −16 dB at frequencies of about 1 GHz.

4. An ONU transceiver module according to claim 1, wherein the RF interface has a back reflection of less than −26 dB at frequencies of about 1 GHz.

5. An ONU transceiver module according to claim 1, wherein the RF interface has a back reflection of less than −30 dB at frequencies of about 1 GHz.

6. An ONU transceiver module according to claim 1, wherein the RF interface has a back reflection of less than −40 dB at frequencies of about 1 GHz.

7. An ONU transceiver module according to claim 1, wherein the means for connecting a first end of the at least one ground pin and the at least one data pin to the RF interface comprises at least one of solder, welding, conductive epoxy, conductive adhesive, and a slip fit connection.

8. An ONU transceiver module according to claim 1, wherein the at least one ground pin has a diameter larger than the at least one data pin.

9. An optical network unit (ONU) transceiver module comprising:
 a housing;
 a printed circuit board disposed in the housing;
 a laser driver disposed on the printed circuit board and configured to receive electrical signals from an external component;
 a post amplifier disposed on the printed circuit board and configured to communicate electrical signals to the external component;
 an RF interface separate from the laser driver and the post amplifier, wherein the RF interface is disposed on the printed circuit board and is configured to receive and transmit RF signals to and from the external component; and
 an RF pin configuration comprising at least one ground pin and at least one data pin, each having a first end and a second end, wherein the first end of the at least one ground pin and the at least one data pin are connected to the RF interface, and a second end of the at least one ground pin and the at least one data pin are configured for connection to the external component.

10. An ONU transceiver module according to claim 9, wherein the first end of the at least one ground pin and the at least one data pin are connected to the RF interface via at least one of the following: a solder connection, a weld connection, a connection formed of a conductive epoxy, a connection formed of a conductive adhesive, and a slip fit connection.

11. An ONU transceiver module according to claim 9, wherein the at least one ground pin has a diameter larger than the at least one data pin.

12. An ONU transceiver module according to claim 9, wherein the RF interface is tuned to an impedance of about 50Ω or about 75Ω.

13. An ONU transceiver module according to claim 9, wherein the RF interface has a back reflection of less than −40 decibels (dB) at frequencies of about 1 GHz.

14. A optical network unit (ONU) transceiver module comprising:
 a housing;
 a printed circuit board disposed in the housing;
 an optical connector configured to connect to an optical fiber;
 a plurality of I/O pins configured for communicating with an external component via electrical signals;
 an RF interface disposed on the printed circuit board and configured to receive and transmit RF signals to and from the external component; and
 an RF pin configuration independent of the plurality of I/O pins, the RF pin configuration comprising:
  at least one ground pin having a first end connected to the RF interface and a second end configured for connection to the external component; and
  at least one data pin having a first end connected to the RF interface and a second end configured for connection to the external component.

15. An ONU transceiver module according to claim 14, wherein the first end of the at least one ground pin and the at least one data pin are connected to the RF interface via at least one of the following: a solder connection, a weld connection, a connection formed of a conductive epoxy, a connection formed of a conductive adhesive, and a slip fit connection.

16. An ONU transceiver module according to claim 14, wherein the at least one ground pin has a diameter larger than the at least one data pin.

17. An ONU transceiver module according to claim 14, wherein the RF interface is tuned to an impedance of about 50Ω or about 75Ω.

18. An ONU transceiver module according to claim 14, wherein the RF interface has a back reflection of less than −40 decibels (dB) at frequencies of about 1 GHz.

19. An ONU transceiver module according to claim 14, further comprising an insulator disposed between the at least one ground pin and the at least one data pin, the insulator comprising air.

* * * * *

UNITED STATES PATENT AND TRADEMARK OFFICE
CERTIFICATE OF CORRECTION

| | | |
|---|---|---|
| PATENT NO. | : 8,145,058 B2 | Page 1 of 1 |
| APPLICATION NO. | : 12/188132 | |
| DATED | : March 27, 2012 | |
| INVENTOR(S) | : Liu et al. | |

It is certified that error appears in the above-identified patent and that said Letters Patent is hereby corrected as shown below:

ON THE TITLE PAGE:

Item (73), under "Assignee" in Column 1, Line 1, delete "Finisar Corporation, Inc." and insert
-- Finisar Corporation --.

Signed and Sealed this
Seventh Day of August, 2012

David J. Kappos
*Director of the United States Patent and Trademark Office*